United States Patent
Lu et al.

(10) Patent No.: US 11,569,304 B2
(45) Date of Patent: Jan. 31, 2023

(54) DISPLAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventors: Jiangnan Lu, Beijing (CN); Shi Shu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 370 days.

(21) Appl. No.: 16/618,297

(22) PCT Filed: Mar. 4, 2019

(86) PCT No.: PCT/CN2019/076850
§ 371 (c)(1),
(2) Date: Nov. 29, 2019

(87) PCT Pub. No.: WO2020/001061
PCT Pub. Date: Jan. 2, 2020

(65) Prior Publication Data
US 2021/0359007 A1    Nov. 18, 2021

(30) Foreign Application Priority Data
Jun. 29, 2018    (CN) .......................... 201810713033.9

(51) Int. Cl.
*H01L 27/32*    (2006.01)
*H01L 51/56*    (2006.01)

(52) U.S. Cl.
CPC ........ *H01L 27/322* (2013.01); *H01L 27/3244* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 6,608,439 B1 * | 8/2003 | Sokolik ................. H01L 51/524 313/506 |
| 10,074,302 B2 | 9/2018 | Liu et al. |

(Continued)

FOREIGN PATENT DOCUMENTS

| CN | 104299973 A | 1/2015 |
| CN | 106158908 A | 11/2016 |

(Continued)

OTHER PUBLICATIONS

First Office Action dated Jun. 4, 2019, for corresponding Chinese application 201810713033.9.

(Continued)

*Primary Examiner* — Nishath Yasmeen
(74) *Attorney, Agent, or Firm* — Nath, Goldberg & Meyer; Joshua B. Goldberg

(57) ABSTRACT

The present disclosure provides a display substrate, a method for manufacturing the same, and a display device. The display substrate includes: a base substrate having pixel regions arranged in an array, each pixel region including a first sub-pixel region and a second sub-pixel region; a light emitting layer and a color conversion layer sequentially stacked on the base substrate; the color conversion layer includes a first color conversion block in at least the first sub-pixel region of at least one pixel region, each of the at least one first color conversion block includes at least two color conversion materials for converting a light component of a color into a light of a target display color, colors of the light components converted by the color conversion materials are different, the target display color is different from the color of the light emitted from the light emitting layer.

11 Claims, 4 Drawing Sheets

(56) References Cited

U.S. PATENT DOCUMENTS

| | | | |
|---|---|---|---|
| 10,267,462 B2 | 4/2019 | Hikmet et al. | |
| 10,283,571 B2* | 5/2019 | Kim | H01L 27/322 |
| 2003/0146696 A1 | 8/2003 | Park et al. | |
| 2005/0248929 A1* | 11/2005 | Kawamura | H01L 51/5281 |
| | | | 313/485 |
| 2006/0267486 A1 | 11/2006 | Feng et al. | |
| 2009/0230853 A1* | 9/2009 | Kanai | H01L 51/0014 |
| | | | 264/293 |
| 2017/0343859 A1* | 11/2017 | Chen | G02B 5/201 |
| 2017/0373229 A1* | 12/2017 | Shin | G02B 1/04 |
| 2018/0024404 A1 | 1/2018 | Suzuki et al. | |

FOREIGN PATENT DOCUMENTS

| | | |
|---|---|---|
| CN | 107208853 A | 9/2017 |
| CN | 107209419 A | 9/2017 |
| CN | 108878497 A | 11/2018 |

OTHER PUBLICATIONS

Second Office Action dated Jan. 22, 2020, for corresponding Chinese application 201810713033.9.

* cited by examiner

DISPLAY SUBSTRATE, METHOD FOR MANUFACTURING THE SAME, AND DISPLAY DEVICE

CROSS-REFERENCE TO RELATED APPLICATIONS

This is a National Phase Application filed under 35 U.S.C. 371 as a national stage of PCT/CN2019/076850, filed Mar. 4, 2019, an application claiming the benefit of Chinese Application No. 201810713033.9, filed Jun. 29, 2018, the content of each of which is hereby incorporated by reference in its entirety.

TECHNICAL FIELD

The present disclosure relates to the field of display technology, and in particular relates to a display substrate, a method for manufacturing the same, and a display device.

BACKGROUND

An Organic Light-Emitting Diode (OLED) display panel includes an anode layer, a light emitting layer, a cathode layer, and a color resist layer sequentially stacked, wherein the color resist layer includes a plurality of color filters of red, green, and blue.

In the OLED display panel, after an electric field is applied to the light emitting layer through the anode layer and the cathode layer, the light emitting layer emits light under an action of the electric field, and after the light emitted from the light emitting layer is irradiated onto the color resist layer, each color filter may filter out light of different colors from the color filter in the light emitted from the light emitting layer and transmit the light of the same color.

SUMMARY

In the embodiments of the present disclosure, a display substrate, a method for manufacturing the same, and a display device are provided. In an embodiment of the present disclosure, there is provided a display substrate, including:

a base substrate having a plurality of pixel regions arranged thereon in an array, each of the pixel regions at least including a first sub-pixel region and a second sub-pixel region;

a light emitting layer and a color conversion layer sequentially stacked on the base substrate;

wherein the color conversion layer includes at least one first color conversion block in at least the first sub-pixel region of at least one of the pixel regions, each of the at least one first color conversion block includes at least two color conversion materials each for converting a light component of a corresponding color in the light emitted from the light emitting layer into a light of a target display color, colors of the light components converted by the at least two color conversion materials are different from each other, and the target display color is different from the color of the light emitted from the light emitting layer.

In an embodiment, the color conversion layer further includes a second color conversion block located in at least the second sub-pixel region of at least one of the pixel regions, the second color conversion block including at least one color conversion material.

In an embodiment, each of the pixel regions includes a red sub-pixel region, a green sub-pixel region and a blue sub-pixel region, the green sub-pixel region is used as the second sub-pixel region and provided with the second color conversion block, and the red sub-pixel region is used as the first sub-pixel region and provided with the first color conversion block.

In an embodiment, the color conversion layer further includes a second color conversion block located in at least the first sub-pixel region and at least the second sub-pixel region of at least one of the pixel regions, in the first sub-pixel region, an orthographic projection of the second color conversion block on the base substrate covers an orthographic projection of the first color conversion block on the base substrate, and the second color conversion block includes at least one color conversion material and is disposed on a side of the first color conversion block proximal to the base substrate.

In an embodiment, the second color conversion block located in at least the first sub-pixel region and at least the second sub-pixel region of at least one of the pixel regions is an integral structure.

In an embodiment, each of the pixel regions includes a red sub-pixel region, a green sub-pixel region and a blue sub-pixel region, the green sub-pixel region is used as the second sub-pixel region and provided with the second color conversion block, and the red sub-pixel region is used as the first sub-pixel region and provided with the first color conversion block and the second color conversion block.

In an embodiment, the first color conversion block includes a red quantum dot material and a red organic fluorescent dye; and the second color conversion block includes a green quantum dot material or a green organic fluorescent dye.

In an embodiment, the green organic fluorescent dye has an absorption spectrum ranging from 500 nm to 560 nm, and the red organic fluorescent dye has an absorption spectrum ranging from 535 nm to 560 nm.

In an embodiment, in the sub-pixel region provided with at least one of the first color conversion block and the second color conversion block, an orthographic projection of the at least one of the first color conversion block and the second color conversion block on the base substrate covers an orthographic projection of the sub-pixel region where the at least one of the first color conversion block and the second color conversion block is located on the base substrate.

In an embodiment, the first color conversion block and the second color conversion block each has a thickness ranging from 2 μm to 5 μm.

In an embodiment, the display substrate further includes a color resist layer disposed on the color conversion layer for filtering out a light component in the light emitted from the light emitting layer that is not converted into the light of the target display color.

The present disclosure further provides a method for manufacturing a display substrate, the method including:

forming a plurality of pixel regions arranged in an array on a base substrate, each of the pixel regions at least including a first sub-pixel region and a second sub-pixel region;

forming a light emitting layer on the base substrate;

forming a color conversion layer on the base substrate on which the light emitting layer is formed using at least two color conversion materials, wherein the color conversion layer includes at least one first color conversion block located in at least the first sub-pixel region of at least one of the pixel regions, each of the color conversion material is used for converting a light component of a corresponding color in the light emitted from the light emitting layer into a light of a target display color, colors of the light components converted by the at least two color conversion materials are different from each other, and the target display color is different from the color of the light emitted from the light emitting layer.

In an embodiment, forming the color conversion layer on the base substrate on which the light emitting layer is formed using at least two color conversion materials includes:

forming a second color conversion block on the base substrate on which the light emitting layer is formed using at least one color conversion material, the second color conversion block being located in at least the second sub-pixel region of at least one of the pixel regions; and forming the first color conversion block on the base substrate on which the second color conversion block is formed using at least two color conversion materials, so as to obtain a color conversion layer including the first color conversion block and the second color conversion block, wherein the first color conversion block is located in at least the first sub-pixel region of at least one of the pixel regions and located in a different sub-pixel region from the second color conversion block.

In an embodiment, each of the pixel regions includes a red sub-pixel region, a green sub-pixel region and a blue sub-pixel region, the green sub-pixel region is used as the second sub-pixel region and provided with the second color conversion block, and the red sub-pixel region is used as the first sub-pixel region and provided with the first color conversion block.

In an embodiment, forming the color conversion layer on the base substrate on which the light emitting layer is formed using at least two color conversion materials includes:

forming a second color conversion block on the base substrate on which the light emitting layer is formed using at least one color conversion material, the second color conversion block being located in at least the first sub-pixel region and the second sub-pixel region of at least one of the pixel regions; and forming the first color conversion block on a side of the second color conversion block distal to the light emitting layer using at least two color conversion materials, so as to obtain a color conversion layer including the first color conversion block and the second color conversion block, wherein in each of the pixel regions formed with the first color conversion block and the second color conversion block, the first color conversion block is located in the first sub-pixel region of the pixel region; and in the first sub-pixel region, an orthographic projection of the second color conversion block on the base substrate covers an orthographic projection of the first color conversion block on the base substrate.

In an embodiment, each of the pixel regions includes a red sub-pixel region, a green sub-pixel region and a blue sub-pixel region, the green sub-pixel region is used as the second sub-pixel region and provided with the second color conversion block, and the red sub-pixel region is used as the first sub-pixel region and provided with the first color conversion block and the second color conversion block.

In an embodiment, the first color conversion block includes a red quantum dot material and a red organic fluorescent dye; and the second color conversion block includes a green quantum dot material or a green organic fluorescent dye.

In an embodiment, the green organic fluorescent dye has an absorption spectrum ranging from 500 nm to 560 nm, and the red organic fluorescent dye has an absorption spectrum ranging from 535 nm to 560 nm.

In an embodiment, the method further includes:

forming a color resist layer on the base substrate on which the color conversion layer is formed for filtering out a light component in the light emitted from the light emitting layer that is not converted into the light of the target display color.

The present disclosure further provides a display device including any one of the display substrates as described above.

BRIEF DESCRIPTION OF DRAWINGS

In order to explain technical solutions in embodiments of the present disclosure more clearly, drawings required for description of the embodiments will now be illustrated briefly, wherein obviously, the drawings described below are merely some embodiments of the present disclosure, and other drawings may be obtained by those skilled in the art based on these drawings without any creative labor.

DETAILED DESCRIPTION

Figure 1:
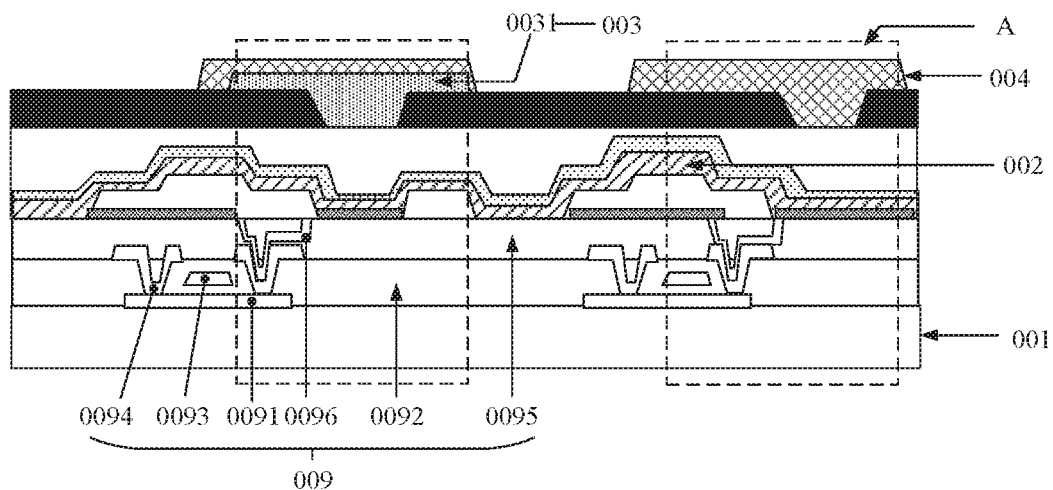
FIG. 1 is a schematic structural diagram of a display substrate according to an embodiment of the present disclosure.

For clarity and better understanding of the objects, technical solutions and advantages of the disclosure, implementations of the disclosure will be further described in detail in conjunction with the accompanying drawings.

In an OLED display panel in the related art, a color resist layer filters out part of the light emitted from a light emitting layer, that is, only part of the light emitted from the light emitting layer are utilized, resulting in a low utilization rate of the light from the light emitting layer.

In an embodiment of the present disclosure, there is provided a display substrate. As shown in the cross-sectional view in FIG. 1, the display substrate may include: a base structure 001 having a plurality of pixel regions arranged thereon in an array, and a light emitting layer 002, a color conversion layer 003 and a color resist layer 004 sequentially stacked on the base substrate 001. Each of the pixel regions may include m sub-pixel regions (each represented by a dashed box A in FIG. 1), m is an integer greater than 1, and the m sub-pixel regions include at least a first sub-pixel region and a second sub-pixel region.

The color conversion layer 003 may include at least one first color conversion block 0031 in at least the first sub-pixel region of at least one of the pixel regions, and each of the at least one first color conversion block 0031 may include at least two color conversion materials each for converting a light component of a corresponding color in the light emitted from the light emitting layer 002 into a light of a target display color. Colors of the light components convened by the at least two color conversion materials are different from each other, and the target display color is different from the color of the light emitted from the light emitting layer 002. A light component in the light emitted from the light emitting layer 002 that is not converted into the light of the target display color may be transmitted through the color conversion layer 003. The light component that is not converted into the light of the target display color is filtered out by the color resist layer 004 when irradiated onto the color resist layer 004.

Optionally, each of the color conversion materials includes a material having a color conversion function such as a quantum dot material or an organic fluorescent dye. Each first color conversion block 0031 may be made of a mixture of at least two quantum dot materials and a photoresist, or each first color conversion block 0031 may be made of a mixture of at least two organic fluorescent dyes and a photoresist, or each first color conversion block 0031 may be made of a mixture of at least two kinds of materials having a color conversion function, such as a quantum dot material and an organic fluorescent dye, and a photoresist, which is not particularly limited in the embodiments of the present disclosure.

Generally, the organic fluorescent dye may be a soluble organic fluorescent dye. Since the color conversion material is usually mixed with the photoresist during manufacture of the first color conversion block, in the case where the organic fluorescent dye is a soluble organic fluorescent dye, a problem of poor solubility of the organic fluorescent dye and the photoresist can be improved to some extent, thereby facilitating manufacture of the first color conversion block.

It should be noted that a front film layer structure 009 for driving the display substrate to display may be further provided between the base substrate 001 and the light emitting layer 002. As shown in FIG. 1, the front film layer structure 009 may include: a buffer layer (not shown in FIG. 1), an active layer (e.g., a low-temperature polysilicon layer) 0091, a gate insulating layer 0092, a gate pattern 0093, an interlayer insulating layer (not shown in FIG. 1), a source/drain pattern 0094, a flat layer 0095, a pixel electrode layer 0096, and the like sequentially stacked on the base substrate 001.

To sum up, the display substrate provided in the embodiment of the present disclosure may include a first color conversion block which may include at least two color conversion materials for converting light components of different colors in the light emitted from the light emitting layer into a light of a target display color, and the light of the target display color is transmitted through a corresponding color resist layer. As a result, more light emitted from the light emitting layer is transmitted compared with the related art, thereby effectively improving the utilization rate of the light emitted from the light emitting layer, and thus further increasing the color gamut of the display substrate.

In the first sub-pixel region provided with the first color conversion block 0031, an orthographic projection of the first color conversion block 0031 on the base substrate 001 may cover an orthographic projection of the sub-pixel region where the first color conversion block 0031 is located on the base substrate 001 so that all light components emitted from the light emitting layer 002 pass through the first color conversion block 0031 before reaching the color resist layer 004, and so that the light components are converted by the first color conversion block 0031 when passing through the first color conversion block 0031, thereby effectively ensuring the utilization rate of the light.

Figure 2:
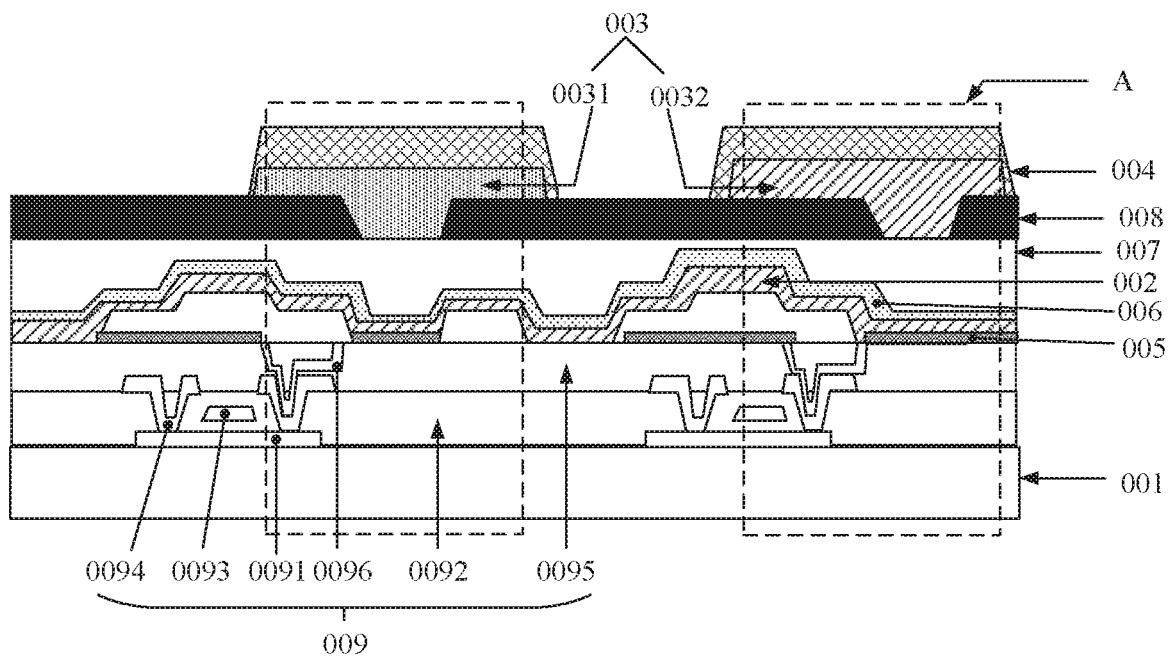
FIG. 2 is a schematic structural diagram of a display substrate according to an embodiment of the present disclosure.

Optionally, referring to FIG. 2, an anode 005 may be disposed on a side of the light emitting layer 002 proximal to the base substrate 001, a cathode 006 may be disposed on a side of the light emitting layer 002 distal to the base substrate 001, an encapsulation layer 007 may be disposed on a side of the cathode 006 distal to the base substrate, and a black matrix 008 may be disposed on a side of the encapsulation layer 007 distal to the base substrate. The encapsulation layer 007 covers an entire surface of the cathode 006 on the side thereof distal to the base substrate to prevent oxygen and moisture from penetrating into a display area where the cathode 006 is located, thereby ensuring normal use of the display function of the display substrate. The black matrix 008 may be disposed in a non-display area and configured to shield light to prevent light leakage from the display substrate.

It should be noted that in order to ensure the utilization rate of light emitted from the light emitting layer 002 throughout the display substrate, the first color conversion block 0031 may be arranged in each of the pixel regions in the manner as shown in FIG. 1 or 2. The embodiments of the present disclosure will be explained by taking an example in which a first color conversion block 0031 is provided in each of the pixel regions.

Optionally, in order to further improve the utilization rate of light, a second color conversion block may be further disposed in the color conversion layer 003, and the second color conversion block may be arranged in various manners. The embodiments of the present disclosure are explained by taking the following two implementations as examples.

In a first implementation, referring to FIG. 2 again, the color conversion layer 003 includes a first color conversion block 0031 and a second color conversion block 0032 located in at least one of the pixel regions. The second color conversion block 0032 is located in at least a second sub-pixel region of at least one of the pixel regions, i.e., the first color conversion block 0031 and the second color conversion block 0032 are located in different sub-pixel regions, and the second color conversion block 0032 may include at least one color conversion material.

Illustratively, each of the pixel regions may include a red sub-pixel region, a green sub-pixel region and a blue sub-pixel region, the green sub-pixel region may be used as the second sub-pixel region and provided with the second color conversion block 0032, and the red sub-pixel region may be used as the first sub-pixel region and provided with the first color conversion block 0031.

The second color conversion block 0032 provided in the green sub-pixel region may include a green quantum dot material or a green organic fluorescent dye. For example, the second color conversion block 0032 may include a green organic fluorescent dye which has an emission spectrum ranging from 500 nm to 560 nm and which has better absorbance for blue light component. When the light emitted from the light emitting layer 002 is white light, the blue light component in the white light is converted into green light when passing through the second color conversion block 0032 to increase an amount of green light emitted to the color filter in the green sub-pixel region, so that more green light is transmitted through the color filter, and the utilization rate of light in the light emitting layer 002 is improved.

The first color conversion block 0031 provided in the red sub-pixel region may include a red quantum dot material and a red organic fluorescent dye. The red quantum dot material may have a particle size of 5 to 9 nanometers, and may have better absorbance for blue light components. The red organic fluorescent dye has an absorption spectrum ranging from 535 nm to 560 nm, and has better absorbance for green light components. When the light emitted from the light emitting layer 002 is white light, the blue and green light components in the white light are converted into red light when passing through the first color conversion block 0031 to increase an amount of red light emitted to the color filter in the red sub-pixel region, so that more red light is transmitted through the color filter, and the utilization rate of light in the light emitting layer 002 is improved.

Figure 3:
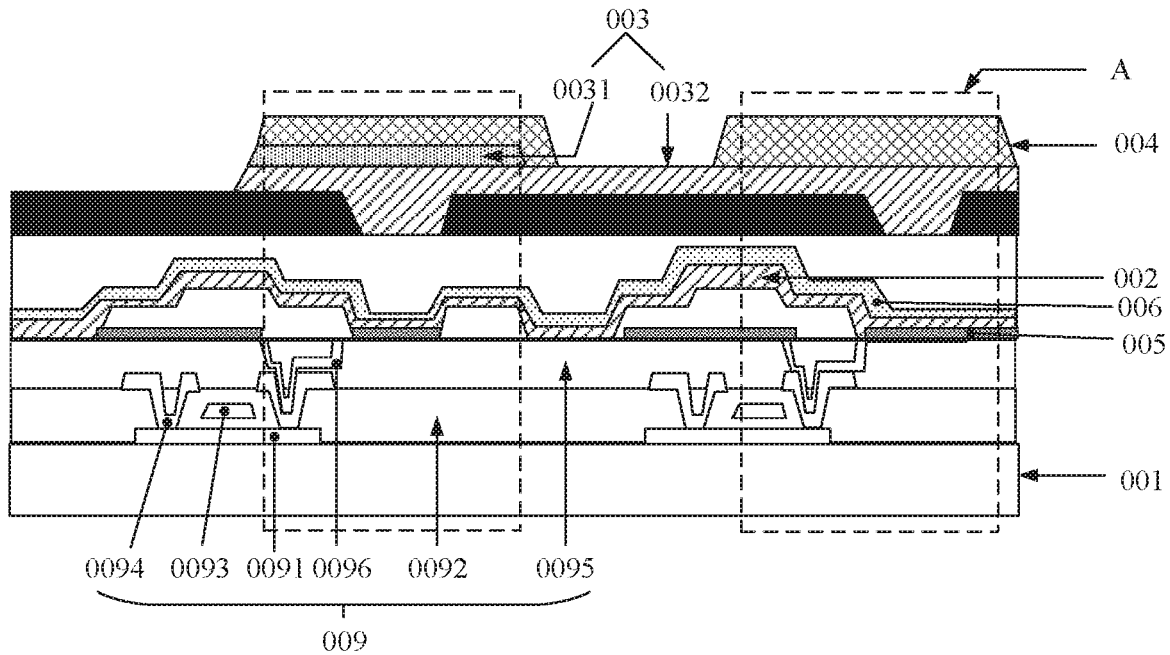
FIG. 3 is a schematic structural diagram of a display substrate according to an embodiment of the present disclosure.

In a second implementation, referring to FIG. 3, the color conversion layer 003 includes a first color conversion block 0031 and a second color conversion block 0032 located in at least one of the pixel regions. In each of the pixel regions provided with the first color conversion block and the second color conversion block, the first color conversion block 0031 may be located in the first sub-pixel region of the pixel region; and the second color conversion block 0032 may be located in at least the first sub-pixel region and at least the second sub-pixel region of the at least one pixel region. That is, the second color conversion block 0032 may be located in at least two sub-pixel regions of the pixel region. In the first sub-pixel region, an orthographic projection of the second color conversion block 0032 on the base substrate 001 covers an orthographic projection of the first color conversion block 0031 on the base substrate 001, and the second color conversion block 0032 may be disposed on a side of the first color conversion block 0031 proximal to the base substrate 001, and may include at least one color conversion material.

In this case, for the first sub-pixel region provided with both the first color conversion block 0031 and the second color conversion block 0032, the second color conversion block 0032 may convert a light component of one color in the light emitted from the light emitting layer 002 into a light of a target display color corresponding to the second color conversion block 0032. In the second sub-pixel region provided with the second color conversion block 0032 but without the first color conversion block 0031, the light of the target display color may directly be transmitted through the color filter in the second sub-pixel region. In the first sub-pixel region provided with the second color conversion block 0032 and the first color conversion block 0031, when the light of the target display color corresponding to the second color conversion block 0032 is irradiated onto the first color conversion block 0031, the first color conversion block 0031 may convert the light of the target display color corresponding to the second color conversion block 0032 into a light of a target display color corresponding to the first color conversion block 0031. The first color conversion block 0031 may further convert a light component of another color in the light emitted from the light emitting layer 002 that is not converted by the second color conversion block 0032 into the light of the target display color corresponding to the first color conversion block 0031. The light of the target display color converted by the first color conversion block 0031 may be transmitted through the color filter in the first sub-pixel region where the first color conversion block 0031 is provided so that the amount of light emitted from the light emitting layer and transmitted through the color filter is increased, and the utilization rate of light in the light emitting layer 002 is improved.

Illustratively, each of the pixel regions may include a red sub-pixel region, a green sub-pixel region and a blue sub-pixel region, the green sub-pixel region may be used as the second sub-pixel region and provided with the second color conversion block 0032, and the red sub-pixel region may be used as the first sub-pixel region and provided with the first color conversion block 0031 and the second color conversion block 0032.

The first color conversion block 0031 disposed in the red sub-pixel region may include a red quantum dot material and a red organic fluorescent dye, and the second color conversion block 0032 disposed in the green sub-pixel region may include a quantum dot material or an organic fluorescent dye. For example, the second color conversion block 0032 may include a green organic fluorescent dye. When the light emitted from the light emitting layer 002 is white light, the second color conversion block 0032 may convert the blue light component in the white light into green light. In the green sub-pixel region, the green light may be directly transmitted through the color filter in the sub-pixel region. In the red sub-pixel region, after the green light is irradiated onto the first color conversion block 0031, the first color conversion block 0031 may convert the green light into red light, and the first color conversion block 0031 may further convert the blue light component in the light emitted from the light emitting layer 002 into red light. The convened red light may be transmitted through the color filter in the red sub-pixel region, thereby improving the utilization rate of the light in the light emitting layer 002.

Optionally, the light emitted from the light emitting layer 002 may be blue light or light of another color. Illustratively, in a case where the light emitted from the light emitting layer 002 is blue light, the light conversion process of the first color conversion block 0031 and the second color conversion block 0032 may be described as follows.

In a case where the second color conversion block 0032 is provided in the green sub-pixel region, the first color conversion block 0031 is provided in the red sub-pixel region, and the second color conversion block 0032 includes a green organic fluorescent dye, while the first color conversion block 0031 includes at least a red quantum dot material, when the blue light emitted from the light emitting layer 002 passes through the second color conversion block 0032, the green organic fluorescent dye in the second color conversion block 0032 may convert the blue light into green light so that the green light is transmitted through the color filter in the green sub-pixel region. When the blue light emitted from the light emitting layer 002 passes through the first color conversion block 0031, the red quantum dot material in the first color conversion block 0031 may convert the blue light into red light so that the red light is transmitted through the color filter in the red sub-pixel region.

In a case where the second color conversion block 0032 is provided in the green sub-pixel region, the first color conversion block 0031 and the second color conversion block 0032 are provided in the red sub-pixel region, and the second color conversion block 0032 includes a green organic fluorescent dye, while the first color conversion block 0031 includes a red quantum dot material and a red organic fluorescent dye, when the blue light emitted from the light emitting layer 002 passes through the second color conversion block 0032, the green organic fluorescent dye in the second color conversion block 0032 may convert the blue light into green light. In the green sub-pixel region, the green light may be directly transmitted through the color filter in the sub-pixel region. In the red sub-pixel region, the green light continues to irradiate to the first color conversion block 0031, the red organic fluorescent dye in the first color conversion block 0031 may convert the green light into red light, and the red quantum dot material in the first color conversion block 0031 may further convert the blue light emitted from the light emitting layer 002 into red light, so that the converted red light may be transmitted through the color filter in the red sub-pixel region.

Further, in the second implementation, the second color conversion block 0032 in at least two sub-pixel regions of one of the pixel regions may be a one-piece structure, that is, the second color conversion block located in at least the first sub-pixel region and at least the second sub-pixel region of one of the pixel regions is a one-piece structure. In this way, a size of the second color conversion block 0032 may be increased. Since the second color conversion block 0032 is manufactured by mixing a quantum dot material or an organic fluorescent dye, or the like, with a photoresist to obtain a mixture, and then forming the second color conversion block 0032 with a pattern on the base substrate 001 with the mixture, but materials such as quantum dot material or organic fluorescent dye typically has poor solubility with the photoresist, greater process difficulties are involved when manufacturing the second color conversion block 0032 of a small size. Therefore, in a case where the size of the second color conversion block 0032 is increased, the process difficulties in manufacture of the second color conversion block 0032 can be reduced, thereby improving the yield of products. In addition, since each sub-pixel region in a high-resolution display substrate has a smaller size, in a case where the second color conversion block 0032 is manufactured in the display substrate in this manner, the process difficulties in manufacture of the second color conversion block 0032 can be reduced due to the increased size, thereby facilitating manufacture of a high-resolution display substrate.

Illustratively, in the related art, a width of one sub-pixel region is 9.6 µm, that is, the width of the second color conversion block 0032 is 9.6 µm in a case where the second color conversion block 0032 is located in the second sub-pixel region. However, in a case where the second color conversion block 0032 in at least the first sub-pixel region and at least the second sub-pixel region is a one-piece structure, the width of the second color conversion block 0032 can be at least up to 19.2 µm. Therefore, in a case where a length of the sub-pixel region is constant, the size of the second color conversion block 0032 is at least doubled due to the second color conversion block 0032 in at least the first sub-pixel region and at least the second sub-pixel region being a one-piece structure, thereby reducing the process difficulties in manufacture of the second color conversion block 0032.

In other embodiments of the present disclosure, the kinds of materials for manufacturing the first color conversion block 0031 and the second color conversion block 0032 may be increased or decreased according to actual needs; and the arrangement manner of the first color conversion block 0031 and the second color conversion block 0032 may be varied according to actual needs. For example, the first color conversion block 0031 may be made of a mixture of a quantum dot material and a photoresist, the second color conversion block 0032 may be made of a mixture of a quantum dot material and a photoresist, and the second color conversion block 0032 in at least the first sub-pixel region and at least the second sub-pixel region may be a one-piece structure. In this case, the process difficulties in manufacture of the second color conversion block 0032 can be reduced due to the increased size thereof, thereby facilitating the manufacture of a high-resolution display substrate.

It should be noted that in order to ensure the utilization rate of light emitted from the light emitting layer 002 throughout the display substrate, the first color conversion block 0031 and the second color conversion block 0032 may be provided in each of the pixel regions in the manner as described above. In the sub-pixel region provided with the second color conversion block 0032, an orthographic projection of the second color conversion block 0032 on the base substrate 001 may cover an orthographic projection of the sub-pixel region where the second color conversion block 0032 is located on the base substrate 001, so that the light emitted from the light emitting layer 002 needs to pass through the second color conversion block 0032 before reaching the color filter. Thus, the second color conversion block 0032 may convert the light component of the corresponding color irradiated thereon, thereby ensuring the utilization rate of the light.

Optionally, the color conversion layer 003 has a thickness ranging from 4 to 10 µm. The first color conversion block 0031 may have a thickness ranging from 2 to 5 µm, and the second color conversion block 0032 may have a thickness ranging from 2 to 5 µm. To sum up, the display substrate provided in the embodiment of the present disclosure includes a first color conversion block which includes at least two color conversion materials for converting light components of different colors in the light emitted from the light emitting layer into a light of a target display color, and the light of the target display color is transmitted through the corresponding color resist layer. As a result, more light emitted from the light emitting layer is transmitted compared with the related art, thereby effectively improving the utilization rate of the light emitted from the light emitting layer, and thus further increasing the color gamut of the display substrate.

Figure 4:
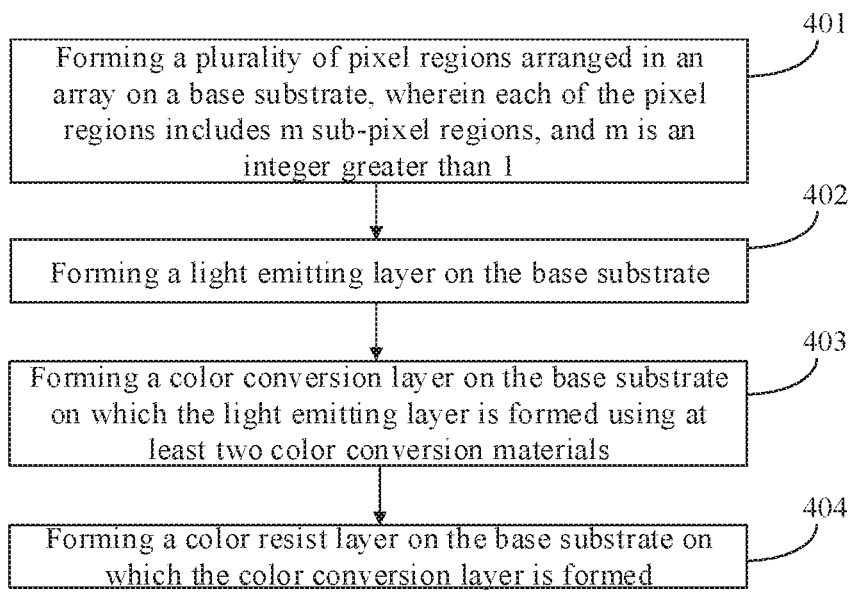
FIG. 4 is a flowchart of a method for manufacturing a display substrate according to an embodiment of the present disclosure.

In an embodiment of the present disclosure, there is further provided a method for manufacturing a display substrate, referring to FIG. 4, the method may include the following steps 401 to 404.

At step 401, a plurality of pixel regions arranged in an array are formed on a base substrate. Each of the pixel regions includes m sub-pixel regions, m is an integer greater than 1, and the m sub-pixel regions may include at least a first sub-pixel region and a second sub-pixel region.

At step 402, a light emitting layer is formed on the base substrate.

At step 403, a color conversion layer is formed on the base substrate on which the light emitting layer is formed using at least two color conversion materials.

The color conversion layer may include at least one first color conversion block located in at least the first sub-pixel region of at least one of the pixel regions. Each of the color conversion materials is used for converting a light component of a corresponding color in the light emitted from the light emitting layer into a light of a target display color. Colors of the light components converted by the at least two color conversion materials are different from each other, and the target display color is different from the color of the light emitted from the light emitting layer.

At step 404, a color resist layer is formed on the base substrate on which the color conversion layer is formed.

To sum up, a method for manufacturing a display substrate is provided in the embodiment of the present disclosure, and the display substrate such manufactured includes a first color conversion block which includes at least two color conversion materials for converting light components of different colors in the light emitted from the light emitting layer into a light of a target display color, and the light of the target display color is transmitted through the color resist layer. As a result, more light emitted from the light emitting layer is transmitted compared with the related art, thereby effectively improving the utilization rate of the light emitted from the light emitting layer, and thus further increasing the color gamut of the display substrate.

Figure 5:
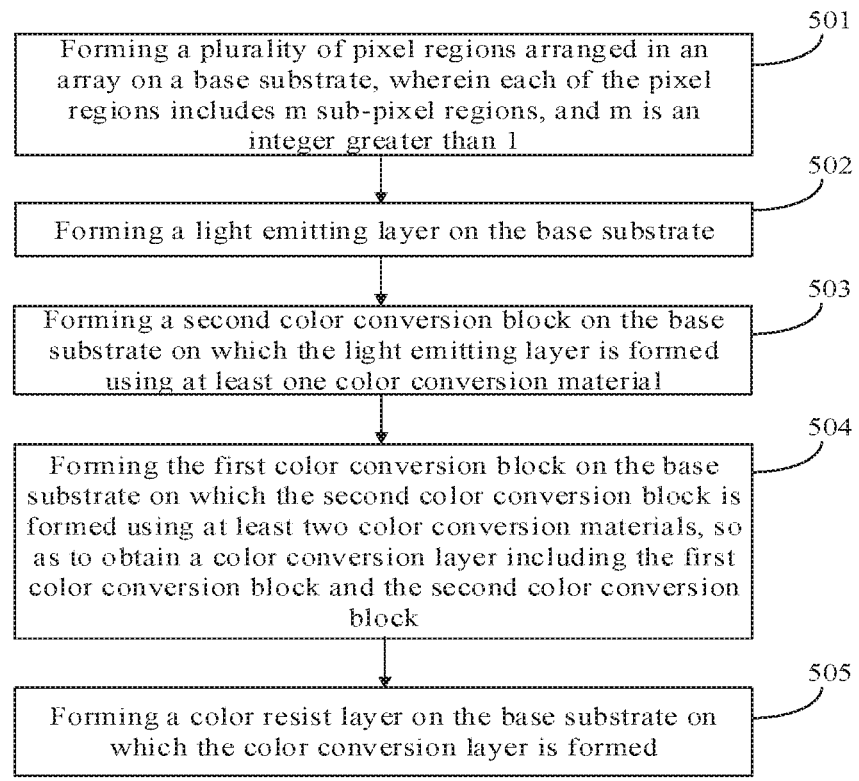
FIG. 5 is a flowchart of a method for manufacturing a display substrate according to an embodiment of the present disclosure.

FIG. 5 is a flowchart of another method for manufacturing a display substrate according to an embodiment of the present disclosure, as shown in FIG. 5, the method may include the following steps 501 to 503.

At step 501, a plurality of pixel regions arranged in an array are formed on a base substrate. Each of the pixel regions may include m sub-pixel regions, m is an integer greater than 1, and the m sub-pixel regions may include at least a first sub-pixel region and a second sub-pixel region.

This step 501 may be implemented differently depending on the method for manufacturing the light emitting layer. For example, when the light emitting layer is manufactured by evaporation, the step 501 may be implemented by placing a mask plate having a predetermined shape on the base substrate, where the mask plate has an opening region corresponding to the light emitting layer, and a non-opening region. When the light emitting layer is manufactured by a solution process, the step 501 may be implemented by manufacturing a pixel defining layer having a predetermined shape on the base substrate, where the pixel defining layer may form a plurality of pixel regions arranged in an array on the base substrate, and each of the pixel regions may include m sub-pixel regions.

At step 502, a light emitting layer is formed on the base substrate.

Optionally, the light emitting layer may at least include a hole injection layer, a hole transport layer, a light emitting material layer, an electron transport layer, an electron injection layer and the like, where the thickness of each film layer may be set according to actual needs. Some film layers such as the electron transport layer and the electron injection layer may be formed by thermal evaporation deposition, while the hole injection layer, the hole transport layer, and the light emitting material layer may be formed by an evaporation coating or solution process (such as inkjet printing, coating, spin coating, and screen printing).

In general, an anode may be disposed on a side of the light emitting layer proximal to the base substrate, and a cathode may be disposed on a side of the light emitting layer distal to the base substrate.

At step 503, a second color conversion block is formed on the base substrate on which the light emitting layer is formed using at least one color conversion material.

The at least one color conversion material is used for converting a light component of a corresponding color in the light emitted from the light emitting layer into a light of a target display color corresponding to the second color conversion block, and the second color conversion block may be located in at least the second sub-pixel region of at least one of the pixel regions.

Optionally, a layer of a second color conversion material may be coated to a certain thickness on the base substrate on which the light emitting layer is formed to obtain a second color conversion material film layer, and then the second color conversion material film layer is exposed, developed or baked or the like to obtain a color conversion layer having a certain pattern and including the second color conversion block. The second color conversion material may be a mixture of one of the materials having a color conversion function such as a quantum dot material and an organic fluorescent dye, and a photoresist. The thickness of the second color conversion material film layer may be set according to actual needs. For example, the second color conversion block may have a thickness ranging from 2 to 5 μm. It should be noted that before the second color conversion block is manufactured, a black matrix layer may be formed on the base substrate on which the light emitting layer is formed.

Before the second color conversion block is manufactured, the arrangement manner of the second color conversion block may be determined according to actual needs, so that a second color conversion block having a certain pattern is formed according to the determined arrangement manner during manufacture of the second color conversion block. The second color conversion block may be arranged in various ways, and one embodiment of the present disclosure is described by taking the following two examples; the second color conversion block located in at least the second sub-pixel region of at least one of the pixel regions, and the second color conversion block located in at least the first sub-pixel region and at least the second sub-pixel region of at least one of the pixel regions.

In one implementation, before forming the second color conversion block on the base substrate on which the light emitting layer is formed, an encapsulation layer and a black matrix may be formed sequentially on a side of the light emitting layer distal to the base substrate (in fact, on a side of the cathode distal to the base substrate).

Figure 6:
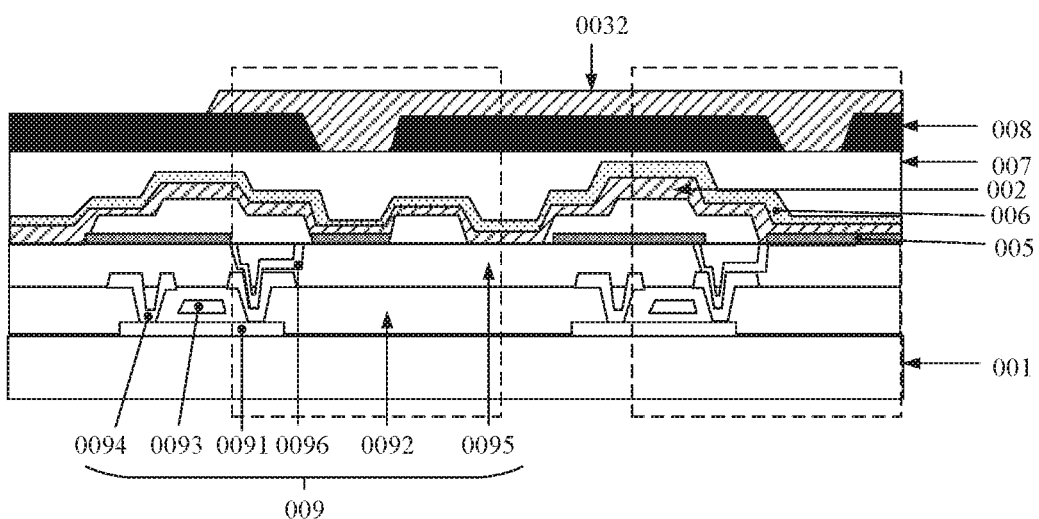
FIG. 6 is a schematic diagram showing a structure in which a second color conversion block is formed on the base substrate on which a light emitting layer is formed according to an embodiment of the present disclosure.

For example, reference may be made to FIG. 6 which illustrates a schematic diagram showing a structure in which the second color conversion block 0032 is formed on the base substrate 001 on which the light emitting layer 002 is formed according to an embodiment of the present disclosure. As shown in FIG. 6, the second color conversion block 0032 is located in two sub-pixel regions, i.e., at least the first sub-pixel region and at least the second sub-pixel region, of each of the pixel regions, and a cathode 006, an encapsulation layer 007 and a black matrix 008 are arranged sequentially between the light emitting layer 002 and the color conversion layer 003.

Optionally, when the second color conversion block is located in at least the first sub-pixel region and at least the second sub-pixel region of each of the pixel regions, the step 503 may be implemented by a process including: forming the second color conversion block in at least the first sub-pixel region and at least the second sub-pixel region on the base substrate on which the light emitting layer is formed through a single patterning process. In a case where the second color conversion block in at least the first sub-pixel region and at least the second sub-pixel region is formed through a single patterning process, a size of the second color conversion block is relatively increased, thereby reducing the process difficulties in manufacture of the second color conversion block, improving the yield of products, and facilitating manufacture of a high-resolution display substrate.

It should be noted that in the sub-pixel region provided with the second color conversion block, an orthographic projection of the second color conversion block on the base substrate covers an orthographic projection of the sub-pixel region where the second color conversion block is located on the base substrate, so that the light emitted from the light emitting layer needs to pass through the second color conversion block before reaching the color filter. The second color conversion block may convert the light component of a corresponding color irradiated thereon, thereby ensuring the utilization rate of the light.

At step 504, the first color conversion block is formed on the base substrate on which the second color conversion block is formed using at least two color conversion materials, so as to obtain a color conversion layer including the first color conversion block and the second color conversion block.

Colors of the light components converted by the at least two color conversion materials are different from each other, and the first color conversion block is configured to convert light components of different colors into a light of a target display color corresponding to the first color conversion block.

Optionally, a layer of a first color conversion material may be coated to a certain thickness on the base substrate on which the second color conversion block is formed to obtain a first color conversion material film layer, and then the first color conversion material film layer is exposed, developed or baked or the like to obtain a first color conversion block having a certain pattern. The first color conversion material may be a mixture of at least two of the materials having a color conversion function such as a quantum dot material and an organic fluorescent dye, and a photoresist. The thickness of the first color conversion material film layer may be set according to actual needs. For example, the first color conversion block may have a thickness ranging from 2 to 5 µm.

In addition, the arrangement manner of the first color conversion block differs from the two arrangement manners of the second color conversion block as follows.

In a case where the second color conversion block is located in at least one sub-pixel region, i.e., the first sub-pixel region, of at least one of the pixel regions, the first color conversion block and the second color conversion block are located in different sub-pixel regions. Illustratively, each of the pixel regions may include a red sub-pixel region, a green sub-pixel region and a blue sub-pixel region, where the green sub-pixel region may be used as the second sub-pixel region and provided with the second color conversion block, and the red sub-pixel region may be used as the first sub-pixel region and provided with the first color conversion block.

In a case where the second color conversion block is located in at least the first sub-pixel region and at least the second sub-pixel region of at least one of the pixel regions, forming the first color conversion block on the base substrate on which the second color conversion block is formed may be implemented by: forming the first color conversion block on a side of the second color conversion block distal to the light emitting layer. Further, in each of the pixel regions provided with the first color conversion block and the second color conversion block, the first color conversion block is located in the first sub-pixel region of the pixel region; and in the first sub-pixel region, an orthographic projection of the second color conversion block on the base substrate covers an orthographic projection of the first color conversion block on the base substrate. Illustratively, each of the pixel regions includes a red sub-pixel region, a green sub-pixel region and a blue sub-pixel region, where the green sub-pixel region may be used as the second sub-pixel region and provided with the second color conversion block, and the red sub-pixel region may be used as the first sub-pixel region and provided with the first color conversion block and the second color conversion block.

For example, the first color conversion block 0031 disposed in the red sub-pixel region may include a red quantum dot material and a red organic fluorescent dye. The red quantum dot material may have a particle size of 5 to 9 nanometers, and may have better absorbance for blue light component. The red organic fluorescent dye has an absorption spectrum ranging from 535 nm to 560 nm, and has better absorbance for green light component. The second color conversion block 0032 disposed in the green sub-pixel region may include a green quantum dot material or a green organic fluorescent dye. For example, the second color conversion block 0032 may include the green organic fluorescent dye which has an emission spectrum ranging from 500 nm to 560 nm and which has better absorbance for blue light component.

Figure 7:
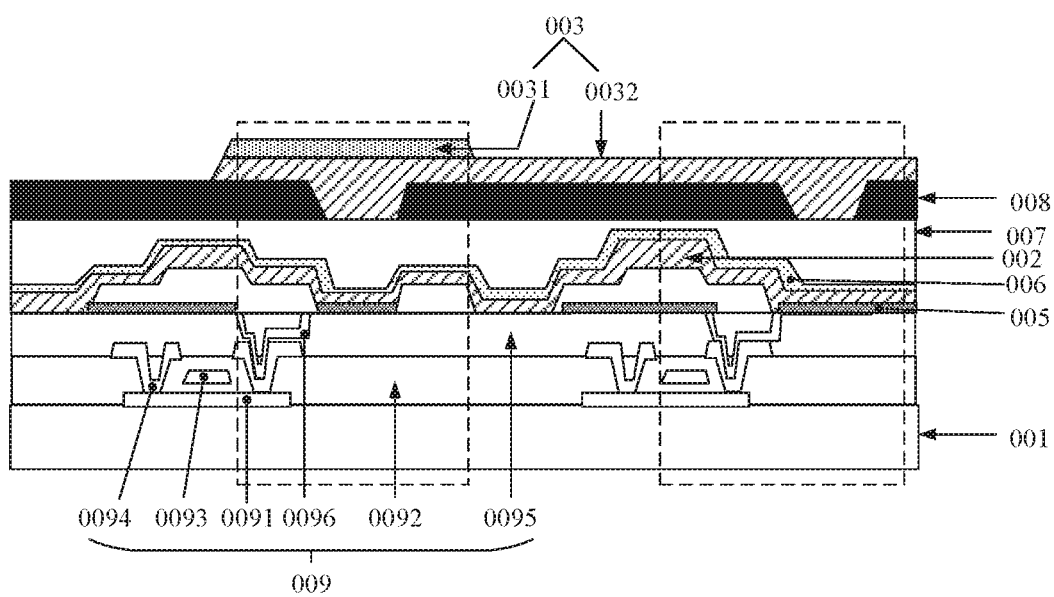
FIG. 7 is a schematic diagram showing a structure in which a first color conversion block is formed on the base substrate on which the second color conversion block is formed according to an embodiment of the present disclosure.

For example, reference may be made to FIG. 7 which illustrates a schematic diagram showing a structure in which the first color conversion block 0031 is formed on the base substrate 001 on which the second color conversion block 0032 is formed according to an embodiment of the present disclosure. As shown in FIG. 7, the first color conversion block 0031 is located in at least the first sub-pixel region (each dashed box in FIG. 7 represents a sub-pixel region), the second color conversion block 0032 is located in at least the first sub-pixel region and the second sub-pixel region of each of the pixel regions, and an orthographic projection of the second color conversion block 0032 on the base substrate 001 covers an orthographic projection of the first color conversion block 0031 on the base substrate 001.

It should be noted that in the first sub-pixel region provided with the first color conversion block, the orthographic projection of the first color conversion block on the base substrate may cover an orthographic projection of the sub-pixel region where the first color conversion block is located on the base substrate so that the light emitted from the light emitting layer needs to pass through the first color conversion block before reaching the color filter. The first color conversion block may convert the light component of the corresponding color irradiated thereon, thereby ensuring the utilization rate of the light.

At step 505, a color resist layer is formed on the base substrate on which the color conversion layer is formed.

The color resist layer may be color filters which generally include a red filter, a green filter and a blue filter. The color filters included in the color resist layer may be manufactured through a single patterning process. The structure obtained by forming a color resist layer 004 on a base substrate 001 on which the color conversion layer 003 is formed as shown in FIG. 7 may refer to FIG. 3.

To sum up, a method for manufacturing a display substrate is provided in the embodiment of the present disclosure, and the display substrate such manufactured includes a first color conversion block which includes at least two color conversion materials for converting light components of different colors in the light emitted from the light emitting layer into a light of a target display color, and the light of the target display color is transmitted through the color resist layer. As a result, more light emitted from the light emitting layer is transmitted compared with the related art, thereby effectively improving the utilization rate of the light emitted from the light emitting layer, and thus further increasing the color gamut of the display substrate.

In an embodiment of the present disclosure, there is further provided a display device including the display substrate provided in any of the above embodiments. The display device may be any product having a display function, such as a liquid crystal panel, an electronic paper, a mobile phone, a tablet, a television, a monitor, a notebook computer, a digital album, or a navigator. Illustratively, the display device may be an OLED or Quantum Dot Light Emitting Diode (QLED) display panel.

The above are only preferred embodiments of the present disclosure and are not intended to limit the present disclosure. Any amendments, equivalent substitutions, improvements, etc. within the principle of the disclosure are all included in the scope of the protection defined by the appended claims of the disclosure.

What is claimed is:

1. A display substrate, comprising:
   a base substrate having a plurality of pixel regions arranged thereon in an array, each of the pixel regions at least comprising a first sub-pixel region and a second sub-pixel region;
   a light emitting layer and a color conversion layer sequentially stacked on the base substrate;
   wherein the color conversion layer comprises at least one first color conversion block in at least the first sub-pixel region of at least one of the pixel regions, each of the at least one first color conversion block comprises at least two color conversion materials,
   wherein the color conversion layer further comprises a second color conversion block located in at least the first sub-pixel region and at least the second sub-pixel region of at least one of the pixel regions,
   in the first sub-pixel region, an orthographic projection of the second color conversion block on the base substrate covers an orthographic projection of the first color conversion block on the base substrate, and
   the second color conversion block comprises at least one color conversion material and is disposed on a side of the first color conversion block proximal to the base substrate, and
   one of the at least two color conversion materials is configured for converting a light component of a corresponding color in the light emitted from the light emitting layer into a light of a target display color, another one of the at least two color conversion materials is configured for converting a light emitted from the second color conversion block into a light of the target display color, and the target display color is different from the color of the light emitted from the light emitting layer and the color of the light emitted from the second color conversion block.

2. The display substrate according to claim 1, wherein the second color conversion block located in at least the first sub-pixel region and at least the second sub-pixel region of at least one of the pixel regions is a one-piece structure.

3. The display substrate according to claim 1, wherein each of the pixel regions comprises a red sub-pixel region, a green sub-pixel region and a blue sub-pixel region, the green sub-pixel region is used as the second sub-pixel region and provided with the second color conversion block, and the red sub-pixel region is used as the first sub-pixel region and provided with the first color conversion block and the second color conversion block.

4. A method for manufacturing a display substrate according to claim 1, the method comprising:
   forming a plurality of pixel regions arranged in an array on a base substrate, each of the pixel regions at least comprising a first sub-pixel region and a second sub-pixel region;
   forming a light emitting layer on the base substrate;
   forming a color conversion layer on the base substrate on which the light emitting layer is formed using at least two color conversion materials, wherein the color conversion layer comprises at least one first color conversion block located in at least the first sub-pixel region of at least one of the pixel regions,
   wherein forming the color conversion layer on the base substrate on which the light emitting layer is formed using at least two color conversion materials comprises:
   forming a second color conversion block on the base substrate on which the light emitting layer is formed using at least one color conversion material, the second color conversion block being located in at least the first sub-pixel region and the second sub-pixel region of at least one of the pixel regions; and
   forming the first color conversion block on a side of the second color conversion block distal to the light emitting layer using at least two color conversion materials, so as to obtain a color conversion layer comprising the first color conversion block and the second color conversion block, wherein in each of the pixel regions formed with the first color conversion block and the second color conversion block, the first color conversion block is located in the first sub-pixel region of the pixel region; and in the first sub-pixel region, an orthographic projection of the second color conversion block on the base substrate covers an orthographic projection of the first color conversion block on the base substrate, and
   one of the at least two color conversion materials is configured for converting a light component of a corresponding color in the light emitted from the light emitting layer into a light of a target display color, another one of the at least two color conversion materials is configured for converting a light emitted from the second color conversion block into a light of the target display color, and the target display color is different from the color of the light emitted from the light emitting layer and the color of the light emitted from the second color conversion block.

5. The method according to claim 4, wherein each of the pixel regions comprises a red sub-pixel region, a green sub-pixel region and a blue sub-pixel region, the green sub-pixel region is used as the second sub-pixel region and provided with the second color conversion block, and the red sub-pixel region is used as the first sub-pixel region and provided with the first color conversion block and the second color conversion block.

6. A display device, comprising the display substrate according to claim 1.

7. The display substrate according to claim 3, wherein
   the first color conversion block comprises a red quantum dot material and a red organic fluorescent dye;
   the second color conversion block comprises a green quantum dot material or a green organic fluorescent dye, and
   the green organic fluorescent dye has an absorption spectrum ranging from 500 nm to 560 nm, and the red organic fluorescent dye has an absorption spectrum ranging from 535 nm to 560 nm.

8. The display substrate according to claim 1, wherein an orthographic projection of the first color conversion block on the base substrate covers an orthographic projection of the first sub-pixel region on the base substrate, and an orthographic projection of the second color conversion block on the base substrate covers orthographic projections of the first sub-ouxek region and the second sub-pixel region on the base substrate.

9. The display substrate according to claim 1, wherein the first color conversion block and the second color conversion block each has a thickness ranging from 2 μm to 5 μm.

10. The display substrate according to claim 1, further comprising a color resist layer disposed on the color conversion layer for filtering out a light component in the light emitted from the light emitting layer that is not converted into the light of the target display color.

11. The method according to claim 4, further comprising:
   forming a color resist layer on the base substrate on which the color conversion layer is formed for filtering out a light component in the light emitted from the light emitting layer that is not converted into the light of the target display color.

* * * * *